United States Patent
Koo et al.

(10) Patent No.: US 9,005,879 B2
(45) Date of Patent: Apr. 14, 2015

(54) METHOD FOR MANUFACTURING ELECTRODE FOR DISPLAY APPARATUS, ELECTRODE FOR DISPLAY APPARATUS MANUFACTURED USING THE SAME, AND DISPLAY APPARATUS INCLUDING THE SAME

(71) Applicants: Ah Reum Koo, Uiwang-si (KR); Min Su Park, Uiwang-si (KR); Dong Il Shin, Uiwang-si (KR); Ryun Min Heo, Uiwang-si (KR); Won Hee Lee, Uiwang-si (KR); Myung Sung Jung, Uiwang-si (KR); Chul Kyu Kim, Uiwang-si (KR)

(72) Inventors: Ah Reum Koo, Uiwang-si (KR); Min Su Park, Uiwang-si (KR); Dong Il Shin, Uiwang-si (KR); Ryun Min Heo, Uiwang-si (KR); Won Hee Lee, Uiwang-si (KR); Myung Sung Jung, Uiwang-si (KR); Chul Kyu Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/097,508

(22) Filed: Dec. 5, 2013

(65) Prior Publication Data
US 2014/0162179 A1  Jun. 12, 2014

(30) Foreign Application Priority Data

Dec. 10, 2012  (KR) .......................... 10-2012-0143076
May 9, 2013  (KR) .......................... 10-2013-0052771

(51) Int. Cl.
*G03F 7/00* (2006.01)

(52) U.S. Cl.
CPC .................................... *G03F 7/0035* (2013.01)

(58) Field of Classification Search
None
See application file for complete search history.

(56) References Cited

U.S. PATENT DOCUMENTS

2009/0153051 A1  6/2009  Hwang et al.

FOREIGN PATENT DOCUMENTS

| JP | 09-306344 A | * | 11/1997 |
| JP | 2004-206883 A | * | 7/2004 |
| KR | 10-2009-0064029 A | | 6/2009 |

OTHER PUBLICATIONS

Computer-generated translation of JP 2004-206883 (Jul. 2004).*
Computer-generated translation of JP 09-306344 (Nov. 1997).*

* cited by examiner

*Primary Examiner* — John A. McPherson
(74) *Attorney, Agent, or Firm* — Lee & Morse, P.C.

(57) ABSTRACT

A method for manufacturing an electrode for a display apparatus includes printing and drying a conductive paste on a substrate, and printing a glass paste on the dried conductive paste, followed by patterning.

11 Claims, 4 Drawing Sheets

METHOD FOR MANUFACTURING ELECTRODE FOR DISPLAY APPARATUS, ELECTRODE FOR DISPLAY APPARATUS MANUFACTURED USING THE SAME, AND DISPLAY APPARATUS INCLUDING THE SAME

CROSS-REFERENCE TO RELATED APPLICATIONS

Korean Patent Application No. 10-2012-0143076, filed on Dec. 10, 2012, in the Korean Intellectual Property Office, and entitled: "Method For Manufacturing Electrode For Display Apparatus, Electrode For Display Apparatus Manufactured Using The Same, and Display Apparatus Including The Same," is incorporated by reference herein in its entirety.

Korean Patent Application No. 10-2013-0052771, filed on May 9, 2013, in the Korean Intellectual Property Office, and entitled: "Method For Manufacturing Electrode For Display Apparatus, Electrode For Display Apparatus Manufactured Using The Same, and Display Apparatus Including The Same," is incorporated by reference herein in its entirety.

BACKGROUND

1. Field

Embodiments relate to a method for manufacturing an electrode for a display apparatus, an electrode for a display apparatus fabricated using the method, and a display apparatus including the same.

2. Description of the Related Art

A display apparatus may include an electrode. The quality of the electrode may affect the performance of the display.

SUMMARY

Embodiments are directed to a method for manufacturing an electrode for a display apparatus, the method including printing and drying a conductive paste on a substrate, and printing a glass paste on the dried conductive paste, followed by patterning.

The glass paste may be printed to a thickness ranging from about 0.1 times to 2 times the thickness of the dried conductive paste.

The dried conductive paste and the glass paste may be subjected to patterning at the same time.

The glass paste may include a glass frit, an organic binder, a photopolymerizable monomer, an initiator, and a solvent.

The glass frit may have a melting point of about 350° C. to about 650° C.

The glass frit may include one or more of $SiO_2$, $B_2O_3$, $Bi_2O_3$, $Al_2O_3$, ZnO, $Na_2O$, $K_2O$, $Li_2O$, BaO, CaO, MgO, SrO, PbO, or $TlO_2$.

The glass paste may include about 30 wt % to about 80 wt % of the glass frit, about 1 wt % to about 30 wt % of the organic binder, about 1 wt % to about 30 wt % of the photopolymerizable monomer, about 0.1 to 10 wt % of the initiator, and the balance of the solvent.

The conductive paste may include a conductive metal powder, an organic binder, a photopolymerizable monomer, an initiator, and a solvent.

The conductive paste may include about 5 wt % to about 95 wt % of the conductive metal powder, about 1 wt % to about 40 wt % of the organic binder, about 1 wt % to about 30 wt % of the photopolymerizable monomer, about 0.1 wt % to about 10 wt % of the initiator, and the balance of the solvent.

The conductive metal powder may include one or more of aluminum, silver, gold, palladium, platinum, copper, chromium, cobalt, tin, lead, zinc, iron, iridium, osmium, rhodium, tungsten, molybdenum, or nickel.

The conductive paste may further include about 1 wt % to about 20 wt % of a glass frit.

Embodiments are also directed to an electrode for a display apparatus prepared by a method according to an embodiment.

Embodiments are also directed to a display apparatus including an electrode for a display apparatus according to an embodiment.

BRIEF DESCRIPTION OF DRAWINGS

Features will become apparent to those of skill in the art by describing in detail example embodiments with reference to the attached drawings in which.

DETAILED DESCRIPTION

Figure 1:
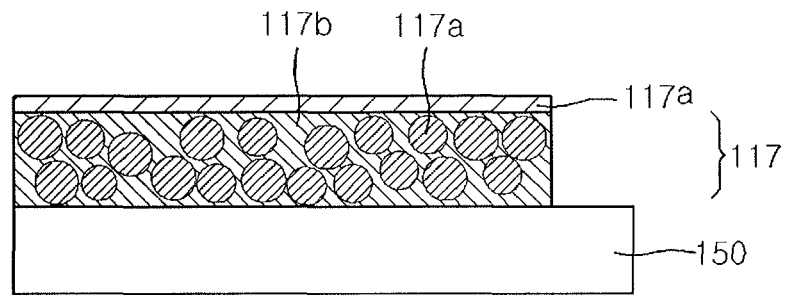
FIG. 1 illustrates a sectional view of an electrode for a display apparatus formed on a substrate, in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

In accordance with an example embodiment, a method for manufacturing an electrode for a display apparatus may include printing and drying a conductive paste on a substrate, and printing a glass paste on the dried conductive paste, followed by patterning.

In an example embodiment, the conductive paste may include a conductive metal powder, an organic binder, a photopolymerizable monomer, an initiator, and a solvent.

The conductive metal powder may include one or more of aluminum (Al), silver (Ag), gold (Au), palladium (Pd), platinum (Pt), copper (Cu), chromium (Cr), cobalt (Co), tin (Sn), lead (Pb), zinc (Zn), iron (Fe), iridium (Ir), osmium (Os), rhodium (Rh), tungsten (W), molybdenum (Mo), or nickel (Ni). In an example embodiment, the conductive metal powder may include aluminum alone, or include, in addition to aluminum, at least one selected from silver (Ag), gold (Au), palladium (Pd), platinum (Pt), copper (Cu), chromium (Cr), cobalt (Co), tin (Sn), lead (Pb), zinc (Zn), iron (Fe), iridium (Ir), osmium (Os), rhodium (Rh), tungsten (W), molybdenum (Mo), and nickel (Ni).

The conductive metal powder may have a spherical, circular, flake, or amorphous shape. For example, the conductive metal powder may be spherical powder.

The conductive metal powder may have an average particle diameter (D50) of about 0.1 μm to about 20 μm. Within this range, it may be possible to perform baking at a temperature of about 600° C. or less, and to achieve good conductivity by improved film density after baking.

Herein, "average particle diameter (D50)" was measured using a Model 1064D (CILAS Co., Ltd.) after dispersing a conductive powder or a glass frit in isopropyl alcohol (IPA) at 25° C. for 3 minutes via ultrasonication.

The conductive metal powder may be present in an amount of about 5 wt % to about 95 wt %, e.g., about 25 wt % to about 70 wt %, for example about 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69 or 70 wt % in the conductive paste. Within this range, the electrode fabricated using the paste may have desired conductivity, and may exhibit excellent adhesion and printability to the substrate.

The organic binder is added to the conductive paste to mix ingredients contained in the paste and to prepare the paste having a predetermined viscosity. From this, it may be possible to prepare an electrode by baking.

The organic binder may include at least one selected from among copolymers obtained by copolymerizing monomers containing a carboxylic acid group, such as (meth)acrylic acid or itaconic acid, and monomers having an ethylene unsaturated double-bond, such as (meth)acrylic ester (methyl acrylate, methyl methacrylate, etc.), styrene, (meth)acrylamide, (meth)acrylonitrile, and the like; cellulose; and water-soluble cellulose derivatives, etc.

The organic binder may be present in an amount of about 1 wt % to about 40 wt %, e.g., about 1 wt % to about 20 wt %, for example about 1, 2, 3, 4, 5, 6, 7, 8, 9, 10, 11, 12, 13, 14, 145, 16, 17, 18, 19 or 20 wt % in the conductive paste. Within this range, it may be possible to avoid reduction in viscosity of the prepared paste and degradation in adhesion after printing and drying. Furthermore, the organic binder may be efficiently decomposed in baking, which may help prevent resistance increase.

The photopolymerizable monomer is a monofunctional or multifunctional (meth)acrylic monomer, and may include at least one selected from, for example, trimethylolpropane ethoxy tri(meth)acrylate, ethyleneglycol di(meth)acrylate, triethylene glycol di(meth)acrylate, diethyleneglycol di(meth)acrylate, propyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, and novolac epoxy(meth)acrylate, etc.

The photopolymerizable monomer may be present in an amount of about 1 wt % to about 30 wt %, e.g., about 1 wt % to about 20 wt %, for example about 1, 2, 3, 4, 5, 6, 7, 8, 9, 10, 11, 12, 13, 14, 15, 16, 17, 18, 19 or 20 wt % in the conductive paste. Within this range, the photopolymerizable monomer may secure efficient photocuring, which may help prevent pattern detachment in development, and the sufficient amount of the photopolymerizable monomer may help prevent decomposition of organic materials in baking.

The initiator initiates photo-reaction in a wavelength range from about 200 nm to 400 nm, and may be at least one compound selected from the group of benzophenone, acetophenone, and triazine compounds, etc. For example, the initiator may be 2-benzyl-2-(dimethylamino)-1-[4-(4-morpholinyl)phenyl]-1-butanone, alpha-dimethoxy-alpha-phenylacetophenone, or a mixture thereof, etc.

The initiator may be present in an amount of about 0.1 wt % to about 10 wt %, e.g., about 0.1 wt % to about 5 wt %, in the conductive paste. Within this range, the initiator may not remain, and may achieve complete curing reaction, which may help avoid detachment of the pattern, prevent resistance increase due to remaining initiator, and provide excellent printability.

The solvent may be a suitable solvent for conductive pastes that has a boiling point of about 120° C. or more.

For example, the solvent may be a solvent that is generally used in conductive pastes, such as an ester, an aliphatic alcohol, a carbitol solvent, or a cellosolve solvent. In an example embodiment, the solvent may include at least one selected from among 2,2,4-trimethyl-1,3-pentanediol monoisobutyrate, methylcellosolve, ethylcellosolve, butylcellosolve, aliphatic alcohol, terpineol, ethylene glycol mono butyl ether, butylcellosolve acetate, texanol, and butyl carbitol acetate.

The solvent may constitute the balance of the composition.

The conductive paste may be free of glass frit, i.e., the content of the glass frit may be 0 wt % in the conductive paste. This is because a glass paste described below includes the glass frit, and in the method according to the present example embodiment, the conductive paste and the glass paste are subjected to patterning at the same time. Thus, the glass frit in the glass paste may be sufficiently used to form a conductive pattern on the conductive paste.

For instance, the conductive paste may include about 5 wt % to about 95 wt % of the conductive metal powder, about 1 wt % to about 40 wt % of the organic binder, about 1 wt % to about 30 wt % of the photopolymerizable monomer, about 0.1 wt % to about 10 wt % of the initiator, and the balance of the solvent. In an implementation, the conductive paste includes about 25 wt % to about 70 wt % of the conductive metal powder, about 1 wt % to about 20 wt % of the organic binder, about 1 wt % to about 20 wt % of the photopolymerizable monomer, about 0.1 wt % to about 5 wt % of the initiator, and the balance of the solvent.

In another embodiment, the conductive paste may further include a small amount of the glass frit. The glass frit contained in the conductive paste may improve adhesion to the substrate and may improve the film density of electrodes by filling voids in the conductive pattern after baking.

The glass frit may be present in an amount of about 0.1 wt % to about 30 wt %, e.g., about 1 wt % to about 20 wt %, for example about 1, 2, 3, 4, 5, 6, 7, 8, 9, 10, 11, 12, 13, 14, 15, 16, 17, 18, 19 or 20 wt % in the conductive paste. Within this range, the glass frit may improve adhesion of the conductive paste to the substrate and may improve the film density of electrodes by filling voids in the conductive pattern after baking.

For instance, the conductive paste may include about 5 wt % to about 95 wt % of the conductive metal powder, about 1 wt % to about 40 wt % of the organic binder, about 1 wt % to about 30 wt % of the photopolymerizable monomer, about 0.1 wt % to about 30 wt % of the glass frit, about 0.1 wt % to about 10 wt % of the initiator, and the balance of the solvent. In an implementation, the conductive paste includes about 30 wt % to about 70 wt % of the conductive metal powder, about 1 wt % to about 30 wt % of the organic binder, about 1 wt % to about 20 wt % of the photopolymerizable monomer, about 1 wt % to about 20 wt % of the glass frit, about 0.1 wt % to about 10 wt % of the initiator, and the balance of the solvent. The glass frit may include one or more of $SiO_2$, $B_2O_3$, $Bi_2O_3$, $Al_2O_3$, $ZnO$, $Na_2O$, $K_2O$, $Li_2O$, $BaO$, $CaO$, $MgO$, $SrO$, $PbO$, or $TlO_2$, etc. In an implementation, the glass frit includes at least one selected from among $Bi_2O_3$, $B_2O_3$, $SiO_2$, and $Al_2O_3$.

The glass frit may have a melting point ranging from about 350° C. to about 650° C. Within this range, the melted glass frit may fill voids in the conductive pattern, which may help improve the film density of electrodes.

The glass frit may have a glass transition temperature from about 300° C. to about 600° C. Within this range, the glass frit may have an appropriate shrinkage rate to help prevent edge curls in the electrodes, and the conductive powder may be sufficiently sintered to help avoid increase in resistance.

The glass frit may have an average particle diameter (D50) of about 0.5 µm to about 3 µm. Within this range, the glass frit may improve the film density of electrodes by filling voids in the conductive pattern.

The glass paste may include a glass frit, an organic binder, a photopolymerizable monomer, an initiator, and a solvent.

The glass frit, the organic binder, the photopolymerizable monomer, the initiator, and the solvent included in the glass paste may be the same as those described above, or may be different therefrom.

The glass frit may be present in an amount of about 30 wt % to about 80 wt % in the glass paste. Within this range, the glass frit may provide good printability and may allow the glass paste to be uniformly printed on the conductive paste. In an implementation, the glass frit is present in an amount of about 50 wt % to about 70 wt %, for example about 50, 51, 52, 53, 54, 55, 56, 57, 58, 59, 60, 61, 62, 63, 64, 65, 66, 67, 68, 69 or 70 wt % in the glass paste.

The organic binder may be present in an amount of about 1 wt % to about 30 wt % in the glass paste. Within this range, the organic binder may improve adhesion to electrodes. In an implementation, the organic binder is present in an amount of about 1 wt % to about 20 wt %, for example about 1, 2, 3, 4, 5, 6, 7, 8, 9, 10, 11, 12, 13, 14, 15, 16, 17, 18, 19 or 20 wt %.

The photopolymerizable monomer may be present in an amount of about 1 wt % to about 30 wt % in the glass paste. Within this range, the photopolymerizable monomer may secure efficient photocuring, which may help prevent pattern detachment in development, and the sufficient amount of the photopolymerizable monomer may avoid decomposition of organic materials in baking. In an implementation, the photopolymerizable monomer is present in an amount of about 1 wt % to about 20 wt %, for example about 1, 2, 3, 4, 5, 6, 7, 8, 9, 10, 11, 12, 13, 14, 15, 16, 17, 18, 19 or 20 wt % in the glass paste.

The initiator may be present in an amount of about 0.1 wt % to about 10 wt % in the glass paste. Within this range, the initiator may achieve complete curing reaction, which may help avoid detachment of the pattern, prevent resistance increase due to remaining organic materials, and provide excellent printability. In an implementation, the initiator is present in an amount of about 1 wt % to about 5 wt %.

The solvent may constitute the balance of the glass paste.

The manufacturing method may include printing and drying the conductive paste on a substrate. The substrate may be, for example, a glass substrate, a metal substrate, or the like.

According to an example embodiment, first, the conductive paste is printed to a thickness from about 5 µm to 40 µm on the substrate, and then dried, thereby preparing the dried conductive paste. Drying is performed under a condition enabling the glass paste to be printed in a subsequent stage, for example, at about 80° C. to about 200° C. for about 5 to 30 minutes.

The manufacturing method may include printing the glass paste on the dried conductive paste, followed by patterning.

The glass paste may be printed over an entire or partial surface of the dried conductive paste on which a pattern is to be formed.

The glass paste may be printed to a thickness from about 0.1 times to 2 times the thickness of the dried conductive paste. Within this thickness range, it may be possible to obtain desired effects by adding the glass paste while ensuring conductivity of electrodes.

The glass paste may be printed to a thickness from about 0.1 µm to about 40 µm, for example, from about 5 µm to about 40 µm, etc.

The glass paste is subjected to printing, followed by patterning.

After printing, the glass paste may be further dried prior to patterning. Drying may help enable more efficient patterning of the conductive paste and the glass paste. Drying may be carried out at about 80° C. to 200° C. for about 5 to 30 minutes, etc.

In an implementation, patterning includes exposure, development, and baking. The dried conductive paste and the glass paste (or the dried glass paste) may be subjected to patterning at the same time. As a result, the baked glass paste may be formed on the conductive pattern while filling voids in the conductive pattern.

In an implementation, exposure is performed by placing a pattern mask on the glass paste and then irradiating the mask with UV light from 100 mJ to 400 mJ at 5 mW to 30 mW. Development is performed to eliminate exposed or unexposed areas, for example, by treating these regions with an aqueous solution of $Na_2CO_3$ at 20° C. to 35° C. Baking is carried out by treating the remaining composition at 450° C. to 600° C. for about 20 to 40 minutes. Baking may allow the organic binder and the solvent in the patterned paste to be completely removed, and cause the glass frit to melt to bind the conductive metal powder. Baking may be performed once or may be performed repeatedly depending on a subsequent dielectric formation process.

In accordance with another example embodiment, an electrode for a display apparatus may be fabricated using the method according to an embodiment.

In an example embodiment, the electrode includes a conductive pattern, and a baked glass paste formed on the conductive pattern, wherein both the conductive pattern and the baked glass paste have the same pattern. Thus, the conductive pattern may not have voids on a surface thereof, which may help prevent gas leakage that may occur in typical electrodes for a display apparatus in the art.

In addition, the conductive paste and the glass paste may be simultaneously subjected to patterning including exposure, development, and baking. As a result, the glass paste may permeate into voids, which may be formed in the conductive pattern during patterning of the conductive paste, and may be baked together therewith. The electrode may include a first phase consisting of the baked conductive paste and a second paste consisting of the baked glass paste, wherein the second phase may be contained in voids formed in the first phase.

Figure 3:
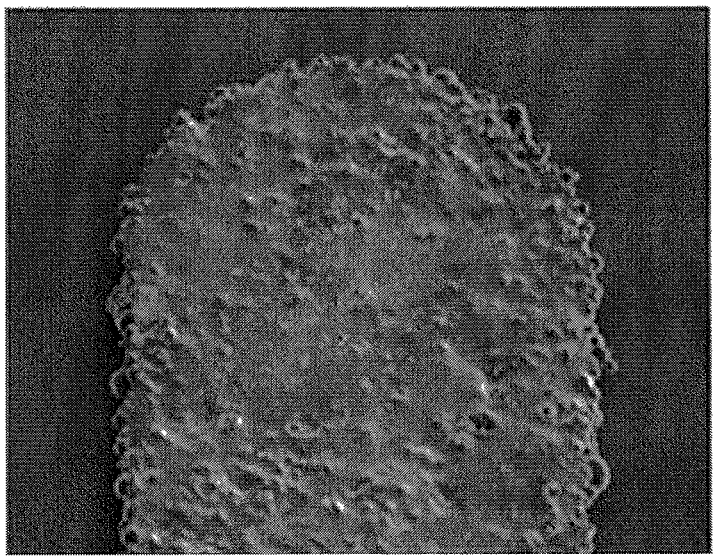
FIGS. 3 and 4 illustrate SEM (scanning electron microscope) images of a surface and cross section, respectively, of an electrode in Example 1.
Figure 4:
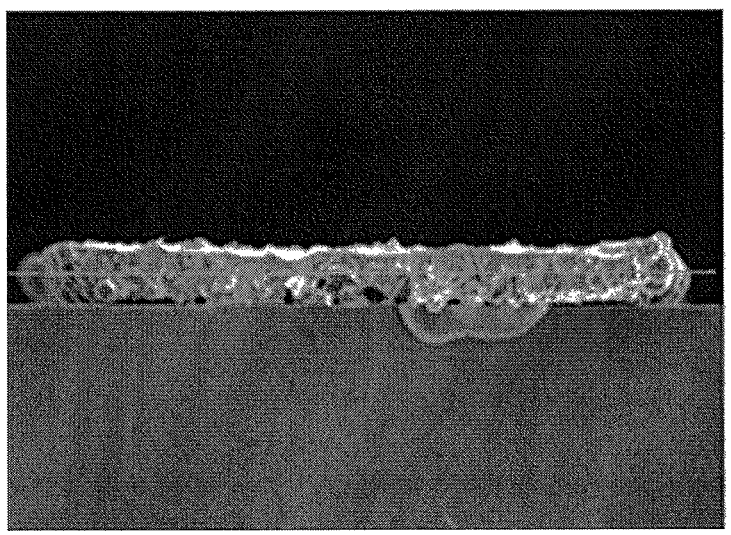

As shown in FIGS. 3 and 4, a electrode in accordance with an embodiment includes the baked glass paste on the surface of the conductive pattern and within the conductive pattern, which may help suppress gas leakage, improve resistance characteristics, and prevent detachment of the conductive pattern and damage to a dielectric layer in laminating the same.

FIG. 1 illustrates a sectional view of an electrode for a display apparatus formed on a substrate, in accordance with an example embodiment. Referring to FIG. 1, an electrode 117 for a display apparatus is formed on a substrate 150 and includes a conductive pattern 117b and a baked glass paste 117a formed on the conductive pattern 117b, wherein the baked glass paste 117a may be present in voids formed within the conductive pattern.

The electrode may have a thickness from about 5 μm to about 20 μm.

The electrode may be used for plasma display electrodes, etc.

In accordance with an example embodiment, a panel for a display apparatus may include the electrode for a display apparatus according to an embodiment. For instance, the panel for a display apparatus may be a panel for a plasma display apparatus.

The panel for a display apparatus may include rear and front substrates facing each other; a plurality of electrodes for a display apparatus formed on the rear substrate; a first dielectric layer formed on the rear substrate and covering the electrodes for a display apparatus; a plurality of partitions adjoining the first dielectric layer and forming a discharge space; a fluorescent layer formed in the discharge layer; a plurality of bus electrodes disposed on a bottom surface in a direction intersecting the address electrodes; and a second dielectric layer covering the bus electrodes.

Figure 2:
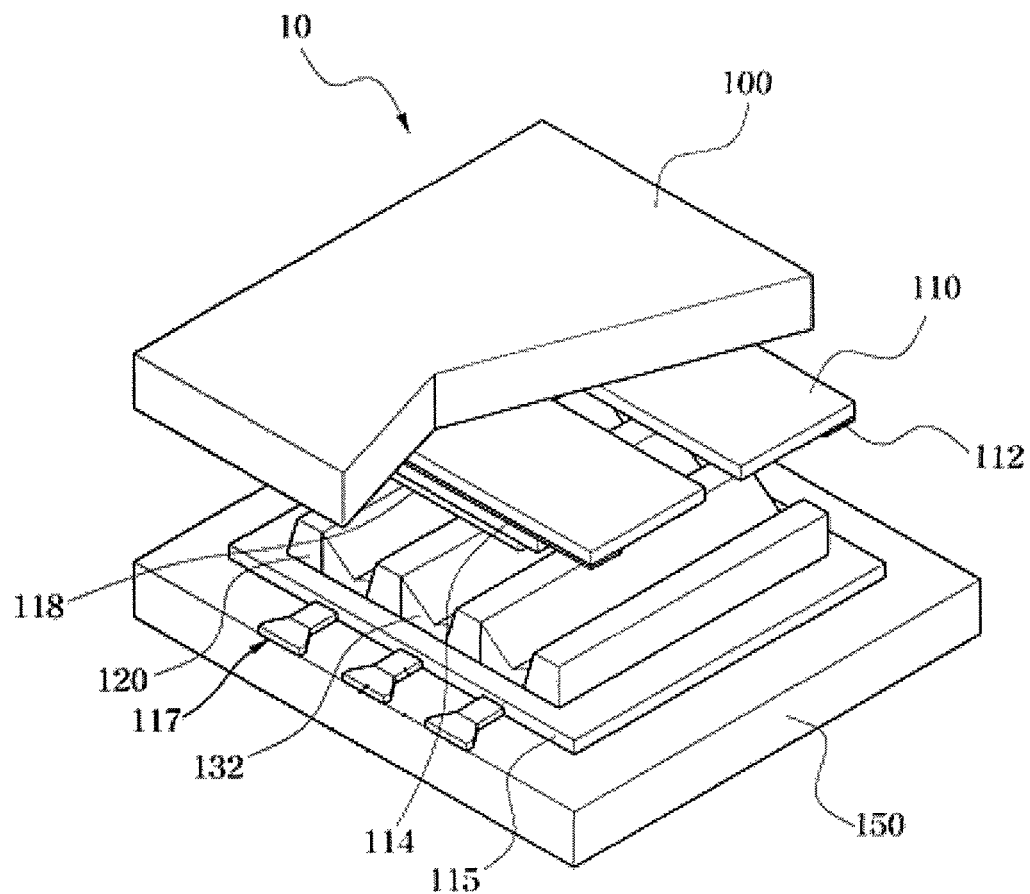
FIG. 2 illustrates a perspective view of a panel for a display apparatus in accordance with an example embodiment.

FIG. 2 illustrates a perspective view of a panel for a display apparatus in accordance with an example embodiment. Referring to FIG. 2, a panel 10 for a display apparatus may include a rear surface 150 and a front substrate 100. A plurality of address electrodes 117 is arranged in a longitudinal direction on the rear substrate 150, and a first dielectric layer 115 is formed to cover the address electrodes 117. On the first dielectric layer 115, a plurality of partitions 120 forms a discharge space in which a fluorescent layer 132 containing RGB phosphors is formed to define pixel regions. The front substrate 100 is disposed to face the rear substrate 150. On the front substrate 100, a plurality of bus electrodes 112 is disposed in a transverse direction to intersect the address electrodes 117. Transparent electrodes 110 may be disposed between the front substrate 100 and the bus electrodes 112, and the bus electrodes 112 may be placed on the transparent electrodes 110. In addition, a second dielectric layer 114 is formed on the transparent electrodes 110 and stores electric charges while covering the bus electrodes 112. Furthermore, an MgO layer 118 may be formed on the transparent electrodes 110 and may serve to protect the second dielectric layer 114 while facilitating electron emission. The address electrodes may have a shape as shown in FIG. 1. An inert gas including Ne, Ar, Xe, Ne+Ar, Ne+Xe, or the like is introduced into a space between the rear substrate and the front substrate, and produces light when voltage higher than a threshold voltage is applied to the electrodes.

In accordance with an example embodiment, a display apparatus including the electrodes for a display apparatus according to an embodiment is provided. The display apparatus may be a plasma display apparatus, etc.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in examples and comparative examples were as follows.

(A) Conductive metal powder: Spherical Al powder having an average particle diameter (D50) of 7 μm (B) Glass frit: Bismuth glass frit ($Bi_2O_3$—$B_2O_3$—$SiO_2$—$Al_2O_3$) (Particology Co., Ltd.)

(C) Organic binder: Poly(methyl methacrylate-CO-methacrylic acid) ((meth)acrylic polymer) solution (CCTech Co., Ltd., solid content: 40 wt %)

(D) Photopolymerizable monomer: Trimethylolpropane ethoxy triacrylate (Photonics Co., Ltd)

(E) Initiator: (E1) 2-benzyl-2-(dimethylamino)-1-[4-(4-morpholinyl)phenyl]-1-butanone, (E2) alpha-dimethoxy-alpha-phenyl acetophenone (CIBA Co., Ltd.)

(F) Solvent: 2,2,4-trimethyl-1,3-pentanediolmono-isobutyrate

Preparative Example 1

Conductive Paste 1

In 12.1 parts by weight of the solvent, 16.6 parts by weight of the organic binder solution, 10.5 parts by weight of the photopolymerizable monomer, and 0.8 parts by weight of the initiator were stirred at 40° C. for 4 hours. 60 parts by weight of the conductive metal powder was added to the mixture, followed by milling and dispersion to prepare a conductive paste.

Preparative Example 2

Conductive Paste 2

In 12.1 parts by weight of the solvent, 16.6 parts by weight of the organic binder solution, 10.5 parts by weight of the photopolymerizable monomer, and 0.8 parts by weight of the initiator were stirred at 40° C. for 4 hours. 50 parts by weight of the conductive metal powder and 10 parts by weight of the glass frit were added to the mixture, followed by milling and dispersion to prepare a conductive paste.

Preparative Example 3

Conductive Paste 3

In 6.1 parts by weight of the solvent, 12.8 parts by weight of the organic binder solution, 8.3 parts by weight of the photopolymerizable monomer, and 0.8 parts by weight of the initiator were stirred at 40° C. for 4 hours. 27 parts by weight of the conductive metal powder and 45 parts by weight of the glass frit were added to the mixture, followed by milling and dispersion to prepare a conductive paste.

Preparative Example 4

Glass Paste

In 12.1 parts by weight of the solvent, 16.6 parts by weight of the organic binder solution, 10.5 parts by weight of the photopolymerizable monomer, and 0.8 parts by weight of the initiator were stirred at 40° C. for 4 hours. 60 parts by weight of the glass frit was added to the mixture, followed by milling and dispersion to prepare a conductive paste.

Example 1

With a screen mask placed on a glass substrate, the paste of Preparative Example 1 was printed to a thickness of 13 μm and dried at 110° C. for 20 minutes. The paste of Preparative Example 4 was printed to a thickness of 16 μm on the dried paste of Preparative Example 1 and dried at 110° C. for 20 minutes. Both the dried pastes of Preparative Examples 1 and 4 were simultaneously subjected to exposure at 14 mW and 200 mJ, followed by development in an aqueous solution of 0.4% $Na_2CO_3$ at 30° C. and drying and baking at 580° C. for 30 minutes, thereby preparing electrodes for a display apparatus, which are composed of a conductive pattern and a baked glass paste formed on the conductive pattern.

Example 2

Electrodes for a display apparatus were prepared by the same method as in Example 1 except that the paste of Preparative Example 2 was used instead of the paste prepared in Preparative Example 1.

Comparative Example 1

With a screen mask placed on a glass substrate, the paste of Preparative Example 1 was printed to a thickness of 13 μm and dried at 110° C. for 20 minutes. The dried paste was subjected to exposure at 14 mW and 200 mJ, followed by development in an aqueous solution of 0.4% $Na_2CO_3$ at 30° C. and drying and baking at 580° C. for 30 minutes, thereby preparing electrodes for a display apparatus.

Comparative Example 2

With a screen mask placed on a glass substrate, the paste of Preparative Example 2 was printed to a thickness of 13 μm and dried at 110° C. for 20 minutes. The dried paste was subjected to exposure at 14 mW and 200 mJ, followed by development in an aqueous solution of 0.4% $Na_2CO_3$ at 30° C. and drying and baking at 580° C. for 30 minutes, thereby preparing electrodes for a display apparatus.

Comparative Example 3

With a screen mask placed on a glass substrate, the paste of Preparative Example 3 was printed to a thickness of 13 μm and dried at 110° C. for 20 minutes. The dried paste was subjected to exposure at 14 mW and 200 mJ, followed by development in an aqueous solution of 0.4% $Na_2CO_3$ at 30° C. and drying and baking at 580° C. for 30 minutes, thereby preparing electrodes for a display apparatus.

The prepared electrodes for a display apparatus were evaluated as to the following properties as listed in Table 1. Further, a surface and a cross-section of each electrode were observed through SEM.

1. Electrode line width after baking (μm): Line width after baking was measured using an AXIO scope (Karl-Zeiss).
2. Electrode thickness (μm): Electrode thickness was measured using a P-10 (Tencor).
3. Line resistance (Ω): Line resistance was measured using a line resistance tester multimeter (KEITHLEY).
4. Gas leakage: Gas leakage was evaluated by confirming whether a turn-on characteristic may be maintained after assembling each of substrates including the electrodes prepared in Examples and Comparative Examples to another substrate (according to occurrence of bubbles in a dielectric layer due to gas leakage). Good turn-on characteristics are indicated by ○ and poor turn-on characteristics are indicated by x.
5. Chemical resistance: After baking, the electrode was dipped in an aqueous solution of 2.5% NaOH, followed by taping test using a 3M tape. No detachment of the electrode due to good resistance to alkali solutions is indicated by ○, and detachment of the electrode is indicated by x.

6. Observation of electrode surface and cross-sectional area through SEM: A surface and a cross-sectional area of the prepared electrode were observed through SEM, and shown in FIGS. 3 to 8.

TABLE 1

| | Example 1 | Example 2 | Comparative Example 1 | Comparative Example 2 | Comparative Example 3 |
|---|---|---|---|---|---|
| Line width after baking (μm) | 105 | 100 | 100 | 97 | 99 |
| Electrode thickness (μm) | 8.3 | 7.5 | 7.2 | 7.4 | 8.6 |
| Line resistance (Ω) | 286 | 360 | 367 | 421 | 648 |
| Gas leakage | ○ | ○ | x | x | x |
| Chemical resistance | ○ | ○ | x | x | x |

As shown in Table 1, the electrode for a display apparatus in accordance with an embodiment, which employed both of the baked glass paste and the conductive pattern, exhibited low line resistance, no gas leakage, and good chemical resistance to alkali solutions. In addition, as shown in FIGS. 3 and 4, the electrode in accordance with an embodiment had no voids on the surfaces thereof. In detail, as shown on the cross-section, an upper region of the electrode with respect to a central line had no voids due to a glass-rich structure thereof and a lower region of the electrode also had no voids due to a conductive powder-rich structure thereof.

Figure 5:
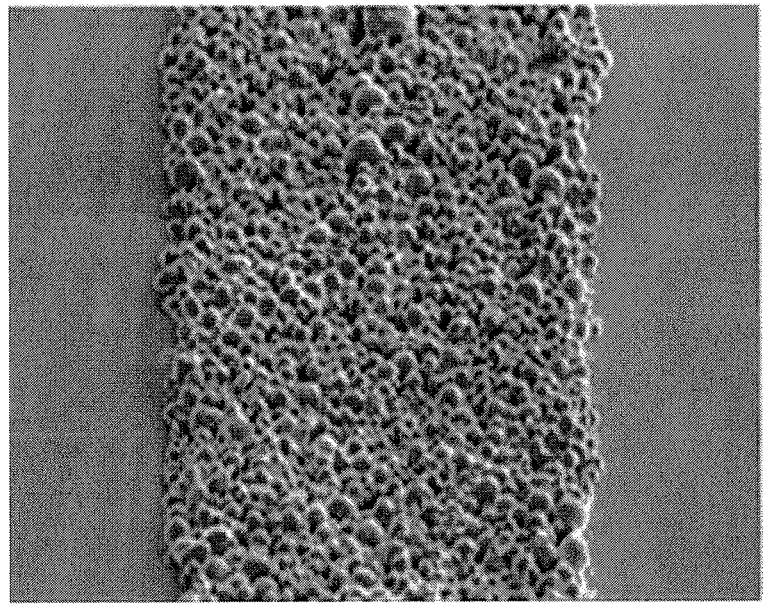
FIGS. 5 and 6 illustrate SEM images of a surface and cross section, respectively, of an electrode in Comparative Example 2.
Figure 6:
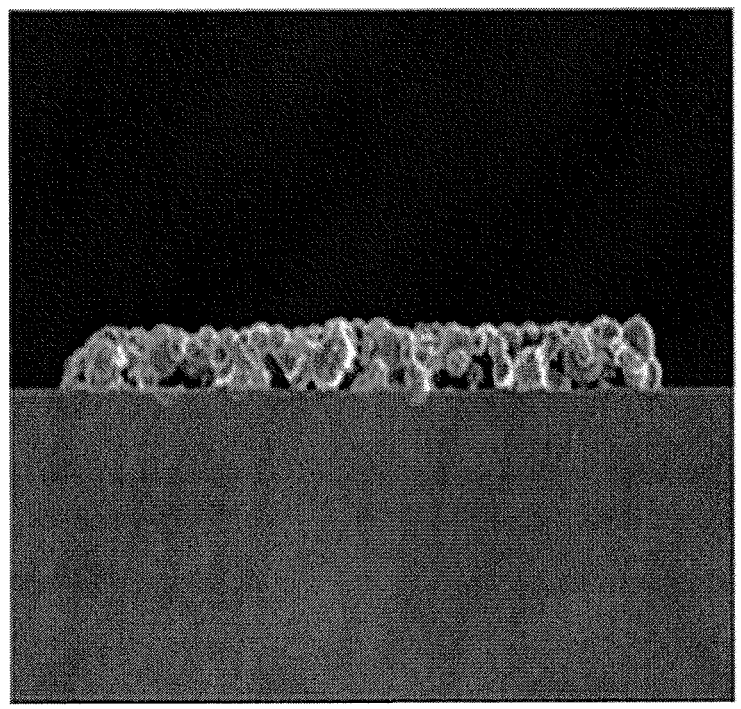
Figure 7:
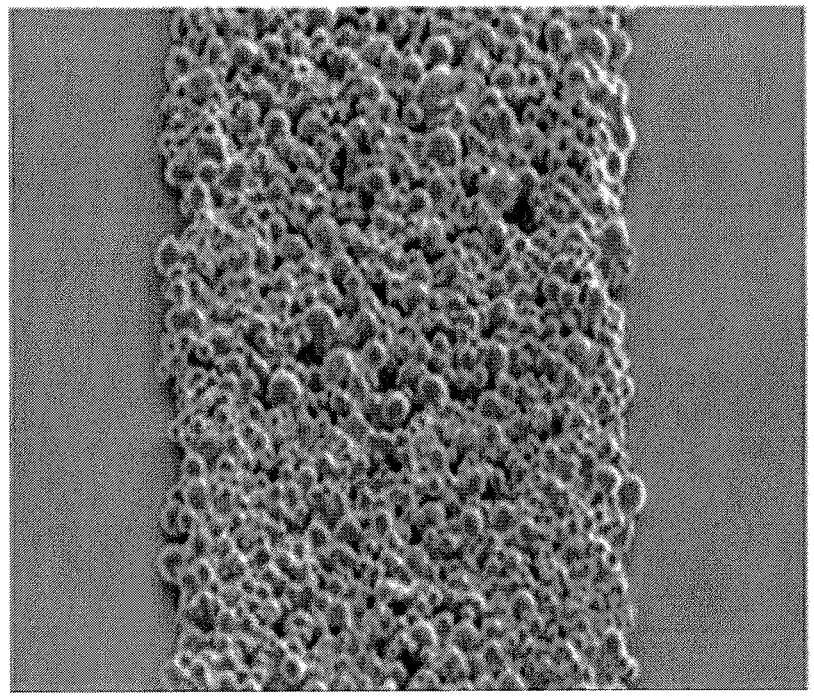
FIGS. 7 and 8 illustrate SEM images of a surface and cross section, respectively, of an electrode in Comparative Example 3.
Figure 8:
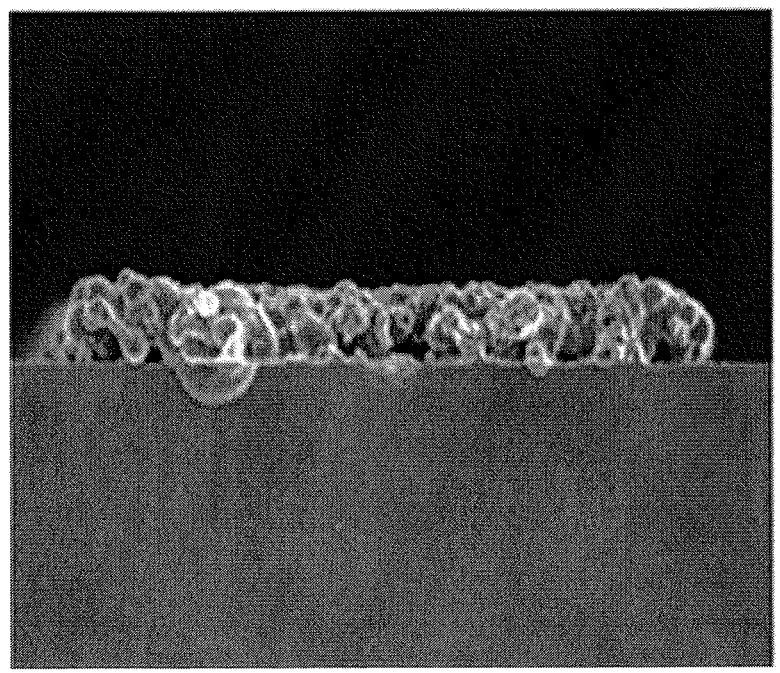

On the contrary, as shown in FIGS. 5 and 6, the electrodes for a display apparatus prepared in Comparative Examples 1 and 2, in which the glass paste was not used or the conductive paste including a small amount of the glass frit was used, had a number of voids on the surfaces thereof. In addition, the electrode for a display apparatus prepared in Comparative Example 3, in which the glass paste was not used and the conductive paste containing the same amount of the glass paste as that of the electrode according to the present invention was used, also had a number of voids on the surface thereof as shown in FIGS. 7 and 8. Further, all of the electrodes for a display apparatus prepared in Comparative Examples 1 to 3 had characteristics such as increase in line resistance, gas leakage, or low resistance to alkali solutions.

By way of summation and review, electrodes containing silver may be used for plasma display panels (PDPs). Electrodes containing silver may have high density, and gas leakage may not occur after baking in a PDP process. However, silver is very expensive and may be economically undesirable in fabrication of electrodes, and migration of silver may cause non-uniform resistance and short circuits at electrode terminals.

As an alternative to silver, aluminum powder may be considered. However, aluminum oxide ($Al_2O_3$) forms at the surface of aluminum powder, which may prevent sufficient sintering, and the thickness of the aluminum oxide layer may increase in the course of baking. This may result in resistance increase of the aluminum electrodes. Further, the interior and surface of the electrodes may be rendered porous due to low film density of the aluminum powder in baking. Such porosity may cause bubble generation in a baked film of the dielectrics in baking of dielectrics and also cause lifting of the electrodes due to penetration of the dielectrics into the electrodes. In addition, the aluminum electrodes may lack a desirable degree of chemical resistance to alkaline solutions, and terminal electrodes may be damaged. Consequently, gas leakage in a plasma display panel may occur after sealing front and rear substrates and introducing Ne or Xe gas.

In another approach, a plasma display panel may include a substrate, electrodes formed on the substrate and composed of a mixture of silver particles and metal particles selected from among copper, nickel and aluminum particles, and glass frits for attaching the electrodes to the substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A method for manufacturing an electrode for a display apparatus, the method comprising:
   printing and drying a conductive paste on a substrate; and
   printing a glass paste on the dried conductive paste, followed by
   patterning,
   wherein,
   the conductive paste includes a conductive metal powder, an organic binder, a photopolymerizable monomer, an initiator, and a solvent, and
   the glass paste consists essentially of a glass frit, an organic binder, a photopolymerizable monomer, an initiator, and a solvent.

2. The method as claimed in claim 1, wherein the glass paste is printed to a thickness ranging from about 0.1 times to 2 times the thickness of the dried conductive paste.

3. The method as claimed in claim 1, wherein the dried conductive paste and the glass paste are subjected to patterning at the same time.

4. The method as claimed in claim 1, wherein the glass frit has a melting point of about 350° C. to about 650° C.

5. The method as claimed in claim 1, wherein the glass fit includes one or more of $SiO_2$, $B_2O_3$, $Bi_2O_3$, $Al_2O_3$, ZnO, $Na_2O$, $K_2O$, $Li_2O$, BaO, CaO, MgO, SrO, PbO, or $TlO_2$.

6. The method as claimed in claim 1, wherein the glass paste further includes about 30 wt % to about 80 wt % of the glass fit, about 1 wt % to about 30 wt % of the organic binder, about 1 wt % to about 30 wt % of the photopolymerizable monomer, about 0.1 to 10 wt % of the initiator, and the balance of the solvent.

7. The method as claimed in claim 1, wherein the conductive paste includes about 5 wt % to about 95 wt % of the conductive metal powder, about 1 wt % to about 40 wt % of the organic binder, about 1 wt % to about 30 wt % of the photopolymerizable monomer, about 0.1 wt % to about 10 wt % of the initiator, and the balance of the solvent.

8. The method as claimed in claim 1, wherein the conductive metal powder includes one or more of aluminum, silver, gold, palladium, platinum, copper, chromium, cobalt, tin, lead, zinc, iron, iridium, osmium, rhodium, tungsten, molybdenum, or nickel.

9. The method as claimed in claim 1, wherein the conductive paste further includes about 1 wt % to about 20 wt % of a glass frit.

10. An electrode for a display apparatus prepared by the method as claimed in claim 1.

11. A display apparatus comprising an electrode for a display apparatus as claimed in claim 10.

* * * * *